(12) United States Patent
Iima et al.

(10) Patent No.: US 12,431,751 B2
(45) Date of Patent: Sep. 30, 2025

(54) ACTUATOR DEVICE MANUFACTURING METHOD

(71) Applicant: HAMAMATSU PHOTONICS K.K., Hamamatsu (JP)

(72) Inventors: Atsuya Iima, Hamamatsu (JP); Yoshihisa Warashina, Hamamatsu (JP); Daiki Suzuki, Hamamatsu (JP); Yasuyuki Sakakibara, Hamamatsu (JP)

(73) Assignee: Hamamatsu Photonics K.K., Hamamatsu (JP)

( * ) Notice: Subject to any disclaimer, the term of this patent is extended or adjusted under 35 U.S.C. 154(b) by 232 days.

(21) Appl. No.: 18/266,640

(22) PCT Filed: Nov. 16, 2021

(86) PCT No.: PCT/JP2021/042110
§ 371 (c)(1),
(2) Date: Jun. 12, 2023

(87) PCT Pub. No.: WO2022/163076
PCT Pub. Date: Aug. 4, 2022

(65) Prior Publication Data
US 2024/0048012 A1    Feb. 8, 2024

(30) Foreign Application Priority Data
Jan. 28, 2021    (JP) ................. 2021-011832

(51) Int. Cl.
*H02K 1/34* (2006.01)
*H02K 33/02* (2006.01)
*H02N 2/00* (2006.01)

(52) U.S. Cl.
CPC ............. *H02K 1/34* (2013.01); *H02K 33/02* (2013.01); *H02N 2/008* (2013.01)

(58) Field of Classification Search
CPC .......... B06B 1/04; H02K 33/02; H02K 33/00; H02K 33/04; H02K 33/06; H02K 33/18;
(Continued)

(56) References Cited

U.S. PATENT DOCUMENTS 4,694,152 A  *  9/1987  Schulz-Hennig ........................ G02B 27/0927
250/206
4,707,597 A  *  11/1987  Schulz-Hennig .... G01B 11/272
356/141.5
(Continued)

FOREIGN PATENT DOCUMENTS

CN      104749769 A    7/2015
CN      119568981 A    3/2025
(Continued)

OTHER PUBLICATIONS

International Preliminary Report on Patentability mailed Aug. 10, 2023 for PCT/JP2021/042110.

*Primary Examiner* — Maged M Almawri
(74) *Attorney, Agent, or Firm* — Faegre Drinker Biddle & Reath LLP

(57) ABSTRACT

An actuator device manufacturing method includes: a preparation step of preparing an actuator device including a support portion, a movable portion, a connection portion, and a metal member disposed such that a stress acts on the metal member when the movable portion oscillates; an oscillation step of oscillating the movable portion for a predetermined time; an acquisition step of acquiring a parameter related to a viscous resistance in a vibration of the movable portion; and a determination step of determining that the actuator device is qualified, when a difference between the parameter acquired in the acquisition step and a reference value corresponding to the parameter at a start of the oscillation step is a predetermined value or more in a
(Continued)

direction in which the viscous resistance decreases, and determining that the actuator device is disqualified, when the difference is less than the predetermined value.

13 Claims, 8 Drawing Sheets

(58) Field of Classification Search
CPC ........ H02K 35/00; H02K 35/02; H02K 35/04; H02K 35/06; H02K 35/12; H02K 35/18; H02K 41/0356; H02K 1/34; B81B 3/0021; B81B 3/00; B81B 3/0045; B81B 3/0078; B81B 3/0072; B81B 2203/0154; G02B 3/0072; G02B 26/10; G02B 26/02; G02B 26/101; G02B 26/085; G02B 26/105; G02B 27/0176; Y10T 74/10; H02N 2/008
USPC ........... 310/15, 300–309, 12.03, 40; 29/596; 359/196.1, 199.4, 201.2, 203.1, 197.1, 359/223.1, 224.1, 211.5
See application file for complete search history.

(56) References Cited

U.S. PATENT DOCUMENTS

| | | | | |
|---|---|---|---|---|
| 5,969,465 A * | 10/1999 | Neukermans | ......... | B81B 3/0078 310/40 MM |
| 6,188,504 B1 * | 2/2001 | Murakami | ......... | G02B 7/1821 359/224.1 |
| 6,232,861 B1 * | 5/2001 | Asada | ......... | G02B 26/101 335/229 |
| 6,392,220 B1 * | 5/2002 | Slater | ......... | G02B 6/327 73/514.01 |
| 6,497,141 B1 * | 12/2002 | Turner | ......... | H03H 9/2405 310/309 |
| 7,034,982 B2 | 4/2006 | Doan | | |
| 7,233,343 B2 * | 6/2007 | Turner | ......... | B41J 2/465 347/243 |
| 7,385,362 B2 * | 6/2008 | Taghezout | ......... | G04G 21/00 318/135 |
| 7,598,697 B2 * | 10/2009 | Welk | ......... | H02P 6/20 700/63 |
| 7,872,394 B1 * | 1/2011 | Gritters | ......... | H02N 1/006 310/309 |
| 8,203,290 B2 * | 6/2012 | Matsubara | ......... | H02P 25/032 318/128 |
| 8,218,218 B2 * | 7/2012 | Tauscher | ......... | G02B 26/085 359/224.1 |
| 9,001,403 B2 * | 4/2015 | Klemer | ......... | G03G 15/04 347/225 |
| 9,606,612 B2 * | 3/2017 | Milford | ......... | H04M 1/72454 |
| 10,330,923 B2 * | 6/2019 | Hino | ......... | G02B 26/085 |
| 10,768,410 B2 * | 9/2020 | Steiner | ......... | G01R 27/2605 |
| 10,840,922 B1 * | 11/2020 | Stelzer | ......... | G01S 7/4865 |
| 11,178,375 B1 * | 11/2021 | Katz | ......... | G06T 3/18 |
| 11,199,695 B2 * | 12/2021 | Suzuki | ......... | G02B 26/085 |
| 11,641,168 B2 * | 5/2023 | Degertekin | ......... | H02J 50/15 310/309 |
| 2001/0022682 A1 * | 9/2001 | McClelland | ......... | G02B 26/0841 359/290 |
| 2002/0130561 A1 * | 9/2002 | Temesvary | ......... | G02B 6/3518 310/12.13 |
| 2002/0135329 A1 * | 9/2002 | Neufeld | ......... | H02N 1/008 318/116 |
| 2003/0042801 A1 * | 3/2003 | Miyajima | ......... | H02P 25/032 310/36 |
| 2004/0184719 A1 * | 9/2004 | Kiadeh | ......... | G02B 6/3572 385/18 |
| 2004/0256921 A1 * | 12/2004 | Turner | ......... | G02B 26/0833 310/36 |
| 2005/0078169 A1 * | 4/2005 | Turner | ......... | G02B 26/101 359/198.1 |
| 2005/0093964 A1 * | 5/2005 | Klement | ......... | G02B 26/105 347/237 |
| 2005/0110586 A1 * | 5/2005 | Klement | ......... | G02B 26/085 331/154 |
| 2005/0225832 A1 | 10/2005 | Doan | | |
| 2005/0231781 A1 * | 10/2005 | Nomura | ......... | G03G 15/043 359/224.1 |
| 2006/0071578 A1 * | 4/2006 | Drabe | ......... | G01C 19/5642 310/309 |
| 2006/0125346 A1 * | 6/2006 | Yoda | ......... | G02B 26/0841 359/290 |
| 2006/0144173 A1 * | 7/2006 | Taghezout | ......... | H02P 25/032 340/407.1 |
| 2006/0152785 A1 * | 7/2006 | Yasuda | ......... | G02B 26/105 359/224.1 |
| 2006/0279364 A1 * | 12/2006 | Klement | ......... | G02B 26/105 331/16 |
| 2007/0017994 A1 * | 1/2007 | Wolter | ......... | B81B 3/007 235/462.37 |
| 2007/0035798 A1 * | 2/2007 | Oettinger | ......... | G02B 26/105 359/213.1 |
| 2007/0241417 A1 | 10/2007 | Huibers et al. | | |
| 2007/0279726 A1 * | 12/2007 | Kato | ......... | G02B 26/127 359/224.1 |
| 2008/0054758 A1 * | 3/2008 | Tsuboi | ......... | H02N 1/008 310/309 |
| 2008/0074718 A1 * | 3/2008 | Bush | ......... | G02B 26/105 359/197.1 |
| 2008/0278785 A1 * | 11/2008 | Klose | ......... | G02B 26/0833 359/213.1 |
| 2008/0297869 A1 * | 12/2008 | Akiyama | ......... | G02B 26/105 359/199.1 |
| 2009/0047527 A1 * | 2/2009 | Yang | ......... | B81B 3/0021 216/22 |
| 2009/0185250 A1 * | 7/2009 | Turner | ......... | G02B 26/105 359/199.1 |
| 2009/0212874 A1 * | 8/2009 | Onuma | ......... | G02B 26/105 331/1 R |
| 2010/0085618 A1 * | 4/2010 | Fujii | ......... | G02B 26/105 359/199.1 |
| 2010/0097681 A1 * | 4/2010 | Klose | ......... | B81B 3/0062 318/116 |
| 2010/0259806 A1 * | 10/2010 | Tauscher | ......... | H04M 1/0272 359/198.1 |
| 2011/0019256 A1 * | 1/2011 | Miyagawa | ......... | G02B 26/105 359/213.1 |
| 2011/0025350 A1 | 2/2011 | Clark | | |
| 2011/0102870 A1 * | 5/2011 | Nakamura | ......... | G02B 26/085 359/198.1 |
| 2012/0162739 A1 * | 6/2012 | Yamada | ......... | G02B 26/101 359/212.1 |
| 2012/0228460 A1 * | 9/2012 | Suzuki | ......... | H10N 30/20 248/474 |
| 2012/0257235 A1 * | 10/2012 | Hino | ......... | H02K 33/16 359/213.1 |
| 2012/0257268 A1 * | 10/2012 | Hino | ......... | B81C 1/00626 310/38 |
| 2012/0307211 A1 * | 12/2012 | Hofmann | ......... | G02B 26/101 353/31 |
| 2012/0319528 A1 * | 12/2012 | Jahnes | ......... | B81C 1/0015 29/827 |
| 2014/0333979 A1 * | 11/2014 | Huang | ......... | G02B 26/105 359/213.1 |
| 2015/0012230 A1 | 1/2015 | Clark | | |
| 2015/0027198 A1 * | 1/2015 | Sessego | ......... | G01P 21/00 73/1.37 |
| 2015/0055202 A1 * | 2/2015 | Inbar | ......... | G02B 26/105 359/199.1 |
| 2015/0092257 A1 * | 4/2015 | Chen | ......... | G02B 26/105 359/213.1 |
| 2015/0109588 A1 * | 4/2015 | Tsai | ......... | G02B 26/10 353/121 |
| 2015/0168715 A1 * | 6/2015 | Vigna | ......... | H02N 1/006 359/199.2 |
| 2015/0185470 A1 * | 7/2015 | Yamano | ......... | G02B 27/0176 359/198.1 |

(56) References Cited

U.S. PATENT DOCUMENTS

| | | | | |
|---|---|---|---|---|
| 2015/0203346 A1* | 7/2015 | Fujimoto | ............. | B81B 3/0072 |
| | | | | 74/1 SS |
| 2015/0233965 A1* | 8/2015 | Guo | ............. | H02N 1/08 |
| | | | | 73/514.32 |
| 2015/0260751 A1* | 9/2015 | Han | ............. | G01P 15/08 |
| | | | | 73/514.33 |
| 2016/0100139 A1* | 4/2016 | Hofmann | ............. | H04N 9/3135 |
| | | | | 359/199.1 |
| 2016/0105090 A1* | 4/2016 | Sadaharu | ............. | G02B 26/101 |
| | | | | 310/38 |
| 2017/0102538 A1* | 4/2017 | Gamet | ............. | G02B 26/101 |
| 2017/0329130 A1* | 11/2017 | Mitterlehner | ............. | F21S 41/675 |
| 2018/0180803 A1* | 6/2018 | Victor | ............. | G02B 6/14 |
| 2018/0332259 A1* | 11/2018 | Le Gros | ............. | H04N 9/3161 |
| 2019/0016589 A1* | 1/2019 | Takimoto | ............. | B81B 7/0006 |
| 2019/0243126 A1* | 8/2019 | Liukku | ............. | G02B 26/101 |
| 2019/0324266 A1* | 10/2019 | Hayashi | ............. | G02B 26/127 |
| 2019/0355290 A1* | 11/2019 | Hayakawa | ............. | H01S 5/0683 |
| 2020/0099357 A1* | 3/2020 | Liukku | ............. | H03H 9/2405 |
| 2020/0314395 A1* | 10/2020 | Greif | ............. | G02B 26/0841 |
| 2021/0223536 A1* | 7/2021 | Brunner | ............. | G02B 26/105 |
| 2021/0255454 A1* | 8/2021 | Nies | ............. | G02B 26/105 |
| 2021/0263304 A1* | 8/2021 | Pilard | ............. | G02B 26/101 |
| 2021/0405350 A1* | 12/2021 | Naono | ............. | H10N 30/20 |
| 2022/0404610 A1* | 12/2022 | Takada | ............. | G02B 27/1066 |
| 2024/0134184 A1* | 4/2024 | Edwin | ............. | G02B 26/101 |

FOREIGN PATENT DOCUMENTS

| | | |
|---|---|---|
| JP | 2000-084900 A | 3/2000 |
| JP | 2010-533875 A | 10/2010 |
| JP | 2013-171226 A | 9/2013 |
| WO | WO-2009/009502 A1 | 1/2009 |
| WO | WO-2019/216424 A1 | 11/2019 |
| WO | WO-2020/032274 A1 | 2/2020 |

* cited by examiner

ACTUATOR DEVICE MANUFACTURING METHOD

TECHNICAL FIELD

One aspect of the present disclosure relates to a method for manufacturing an actuator device configured as, for example, a micro electro mechanical systems (MEMS) device.

BACKGROUND ART

An actuator device including a support portion, a movable portion oscillatably connected to the support portion, and a coil that generates a driving force to oscillate the movable portion has been known (for example, refer to Patent Literature 1). Patent Literature 1 discloses a MEMS scanning mirror in which a mirror is provided on a movable portion.

CITATION LIST

Patent Literature

Patent Literature 1: Japanese Unexamined Patent Publication No. 2013-171226

SUMMARY OF INVENTION

Technical Problem

In the actuator device described above, when the actuator device is used at a customer's site after being shipped, the vibration characteristics of the movable portion may change over usage time. Since such a change in the vibration characteristics can become a cause of malfunction, suppressing such a change is required.

Therefore, one aspect of the present disclosure aims to provide an actuator device manufacturing method capable of obtaining an actuator device having stable quality.

Solution to Problem

According to one aspect of the present disclosure, there is provided an actuator device manufacturing method including: in the following order, a preparation step of preparing an actuator device including a support portion, a movable portion, a connection portion that connects the movable portion to the support portion such that the movable portion is oscillatable around a predetermined axis, and a metal member disposed such that a stress acts on the metal member when the movable portion oscillates around the axis; an oscillation step of oscillating the movable portion around the axis for a predetermined time; an acquisition step of acquiring a parameter related to a viscous resistance in a vibration of the movable portion around the axis; and a determination step of determining that the actuator device is qualified, when a difference between the parameter acquired in the acquisition step and a reference value corresponding to the parameter at a start of the oscillation step is a predetermined value or more in a direction in which the viscous resistance decreases, and determining that the actuator device is disqualified, when the difference is less than the predetermined value.

In the case where the actuator device includes the metal member disposed such that the stress acts on the metal member when the movable portion oscillates around the axis, when the movable portion oscillates around the axis, the metal member may undergo repeated plastic deformation due to the action of the stress. When the metal member undergoes the repeated plastic deformation, work hardening progresses, thereby making it difficult for plastic deformation to occur, and as a result, the viscous resistance in the vibration of the movable portion around the axis may gradually decrease. The inventors have found that the decrease in viscous resistance is one of the causes of the change in the vibration characteristics of the movable portion described above. Therefore, in the actuator device manufacturing method, after the oscillation step of oscillating the movable portion around the axis for the predetermined time, the acquisition step of acquiring a value of the parameter related to the viscous resistance in the vibration of the movable portion around the axis is performed. Then, when the difference between the parameter acquired in the acquisition step and the reference value corresponding to the parameter at the start of the oscillation step is the predetermined value or more in the direction in which the viscous resistance decreases, it is determined that the actuator device is qualified, and when the difference is less than the predetermined value, it is determined that the actuator device is disqualified. For example, the actuator device determined to be qualified is shipped, and the actuator device determined to be disqualified is not shipped. By reducing the viscous resistance in advance through oscillating the movable portion for the predetermined time before shipment, a change in the vibration characteristics of the movable portion at a customer's site can be suppressed, and the quality of the actuator device can be stabilized. In addition, there can exist the actuator device in which the viscous resistance does not decrease even when the movable portion is oscillated for the predetermined time; however, by determining that the actuator device in which the difference between the acquired parameter and the reference value is the predetermined value or more is qualified, only the actuator device in which the viscous resistance has decreased can be shipped, and as a result, the quality of the actuator device can be further stabilized. Therefore, according to the actuator device manufacturing method, the actuator device having stable quality can be obtained.

The parameter may relate to a Q value, a resonant frequency, a drive current value for obtaining a predetermined deflection angle, or a deflection angle when a predetermined drive current is applied. In this case, a change in viscous resistance can be suitably assessed.

In the oscillation step, the movable portion may be oscillated in a state where a temperature of each of the movable portion and the connection portion is higher than a temperature of the support portion. In this case, the viscous resistance can be effectively reduced.

In the oscillation step, the movable portion may be oscillated at a constant temperature. In this case, for example, by performing the oscillation step at the same temperature as in a usage environment at a customer's site, a change in the vibration characteristics of the movable portion at the customer's site can be reliably suppressed.

In the oscillation step, the movable portion may be oscillated under a constant pressure. In this case, a change in viscous resistance due to a change in the atmospheric pressure can be suppressed, and a change in viscous resistance due to the work hardening of the metal member can be suitably assessed.

In the preparation step, a plurality of the actuator devices may be prepared, and the oscillation step, the acquisition step, and the determination step may be performed for each of the plurality of actuator devices. In this case, the actuator devices having stable quality can be efficiently manufactured.

The actuator device prepared in the preparation step may include a coil that generates a driving force to oscillate the movable portion, and the coil may form the metal member. In this case, the quality of the actuator device including the coil can be stabilized.

The coil may be embedded in a groove. In this case, the cross-sectional area of the coil becomes large, and the coil is likely to undergo work hardening due to repeated plastic deformation; however, according to the actuator device manufacturing method, even in such a case, a change in the vibration characteristics of the movable portion at a customer's site can be suppressed.

The actuator device prepared in the preparation step may include a drive element that generates a driving force to oscillate the movable portion, and a wiring electrically connected to the drive element, and the wiring may form the metal member. In this case, the quality of the actuator device including the wiring electrically connected to the drive element can be stabilized.

The wiring may be embedded in a groove. In this case, the cross-sectional area of the wiring becomes large, and the wiring is likely to undergo work hardening due to repeated plastic deformation; however, according to the actuator device manufacturing method, even in such a case, a change in the vibration characteristics of the movable portion at a customer's site can be suppressed.

The actuator device prepared in the preparation step may further include a package that is airtightly sealed and that houses the support portion, the movable portion, the connection portion, and the metal member. In this case, a change in viscous resistance due to a change in the atmospheric pressure can be suppressed, and a change in viscous resistance due to the work hardening of the metal member can be suitably assessed.

In the actuator device prepared in the preparation step, the movable portion may include a first movable portion and a second movable portion. The connection portion may include a first connection portion that connects the first movable portion to the second movable portion such that the first movable portion is oscillatable around a first axis, and a second connection portion that connects the second movable portion to the support portion such that the second movable portion is oscillatable around a second axis. In the oscillation step, for the predetermined time, the first movable portion may be oscillated around the first axis, and the second movable portion may be oscillated around the second axis. In this case, the oscillation step can be performed in the same actuation state as in a usage environment at a customer's site, and a change in the vibration characteristics of the movable portion at the customer's site can be reliably suppressed. In addition, when movable portions are oscillated around a plurality of axes, the drive current value becomes large, and the environmental temperature is likely to become high; however, according to the actuator device manufacturing method, even in such a case, a change in the vibration characteristics of the movable portion at a customer's site can be suppressed.

In the oscillation step, the movable portion may be resonantly actuated. In this case, the stress acting on the metal member becomes large, and the metal member is likely to undergo work hardening due to repeated plastic deformation; however, according to the actuator device manufacturing method, even in such a case, a change in the vibration characteristics of the movable portion at a customer's site can be suppressed.

Advantageous Effects of Invention

According to one aspect of the present disclosure, it is possible to provide the actuator device manufacturing method capable of obtaining the actuator device having stable quality.

DESCRIPTION OF EMBODIMENTS

Hereinafter, one embodiment of the present disclosure will be described in detail with reference to the drawings. In the following description, the same reference signs are used to denote the same or equivalent elements, and duplicate descriptions will be omitted.

Actuator Device

Figure 1:
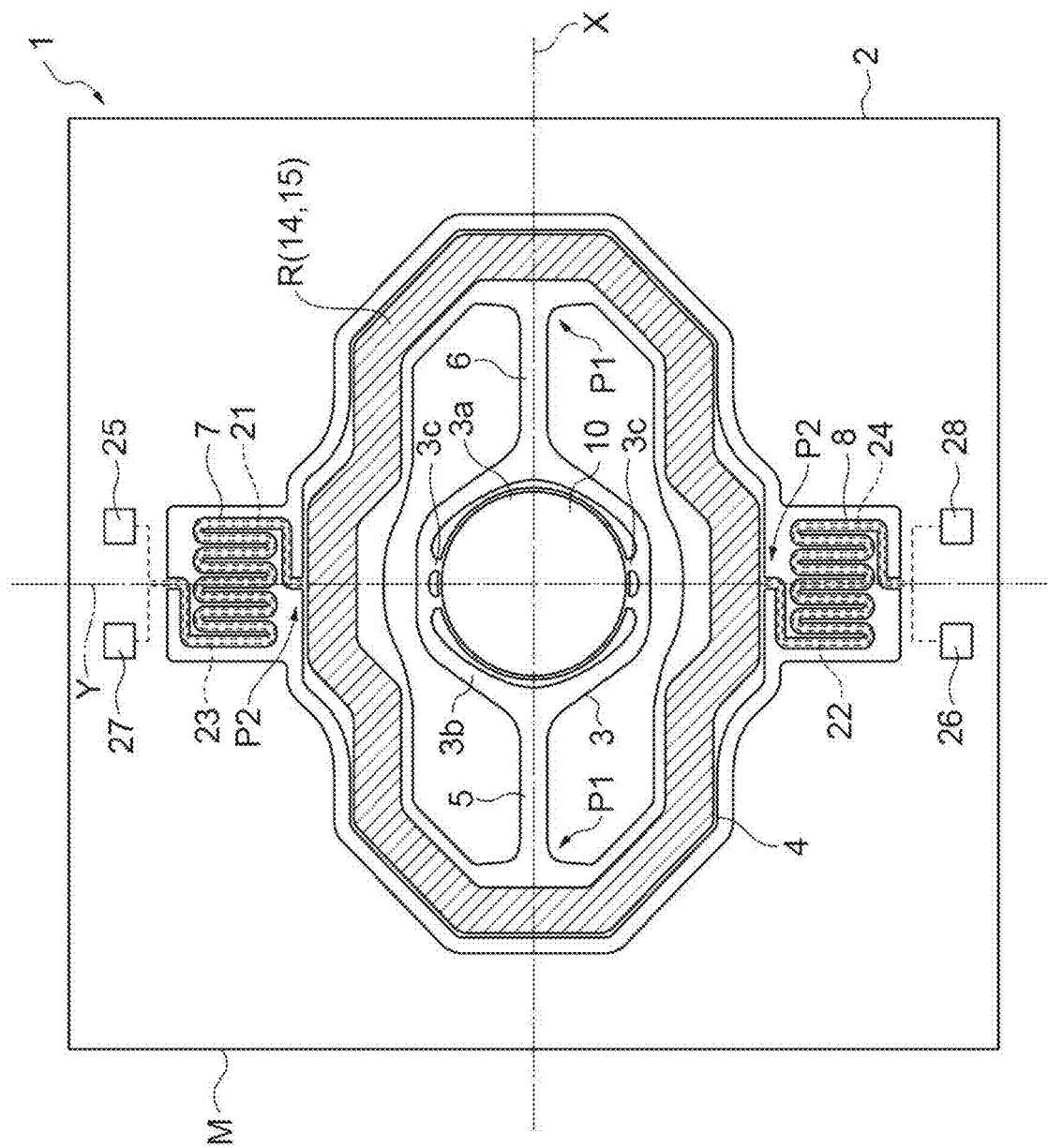
FIG. 1 is a plan view of an actuator device according to an embodiment.

As shown in FIG. 1, an actuator device 1 includes a support portion 2, a first movable portion 3, a second movable portion 4, a pair of first connection portions 5 and 6, a pair of second connection portions 7 and 8, and a magnetic field generation portion M. The support portion 2, the first movable portion 3, the second movable portion 4, the pair of first connection portions 5 and 6, and the pair of second connection portions 7 and 8 are integrally formed by, for example, a silicon-on-insulator (SOI) substrate. Namely, the actuator device 1 is configured as a MEMS device. The SOI substrate includes a pair of silicon layers and an insulating layer disposed between the pair of silicon layers. The support portion 2 is formed of the pair of silicon layers and the insulating layer. The first movable portion 3, the second movable portion 4, the pair of first connection portions 5 and 6, and the pair of second connection portions 7 and 8 are formed of one of the pair of silicon layers.

In the actuator device 1, the first movable portion 3 having a mirror surface 10 is oscillated around each of an X-axis (first axis) and a Y-axis (second axis perpendicular to the first axis) orthogonal to each other. Namely, the actuator device 1 is configured as a mirror device. The actuator device 1 can be used in an optical switch for optical communication, an optical scanner, and the like.

The support portion 2 is formed in a frame shape having a rectangular outer shape, and supports the first movable portion 3, the second movable portion 4, and the like. The first movable portion 3 is disposed inside the support portion 2. The first movable portion 3 includes a body portion 3a, an annular portion 3b, and a pair of connection portions 3c.

The body portion 3a is formed in a circular shape. On a surface of the body portion 3a, for example, the mirror surface 10 having a circular shape is provided by a metal film made of aluminum. The annular portion 3b is formed in an annular shape to surround the body portion 3a. The pair of connection portions 3c are each disposed on both sides of the body portion 3a on the Y-axis, and connect the body portion 3a and the annular portion 3b.

The second movable portion 4 is formed in a frame shape, and is disposed inside the support portion 2 to surround the first movable portion 3. The magnetic field generation portion M is formed of, for example, a permanent magnet with a Halbach array and the like, and generates a magnetic field that acts on coils 14 and 15 to be described later. The magnetic field generation portion M is disposed on one side (side opposite the mirror surface 10) in a direction perpendicular to the X-axis and Y-axis with respect to the support portion 2, the first movable portion 3, the second movable portion 4, and the like.

The first connection portions 5 and 6 are each disposed on both sides of the first movable portion 3 on the X-axis. The first connection portions 5 and 6 connect the first movable portion 3 (annular portion 3b) to the second movable portion 4 on the X-axis such that the first movable portion 3 is oscillatable around the X-axis (with the X-axis as a centerline). As will be described later, the first connection portions 5 and 6 are connected to the support portion 2 via the second movable portion 4 and the second connection portions 7 and 8. Namely, the first connection portions 5 and 6 can also be regarded as connecting the first movable portion 3 to the support portion 2 such that the first movable portion 3 is oscillatable around the X-axis. Each of the first connection portions 5 and 6 is a torsion bar that torsionally deforms when the first movable portion 3 oscillates around the X-axis. Each of the first connection portions 5 and 6 extends linearly on the X-axis.

The second connection portions 7 and 8 are each disposed on both sides of the second movable portion 4 on the Y-axis. The second connection portions 7 and 8 connect the second movable portion 4 to the support portion 2 on the Y-axis such that the second movable portion 4 is oscillatable around the Y-axis (with the Y-axis as a centerline). Each of the second connection portions 7 and 8 is a torsion bar that torsionally deforms when the second movable portion 4 oscillates around the Y-axis. Each of the second connection portions 7 and 8 extends in a meandering manner.

Figure 2:
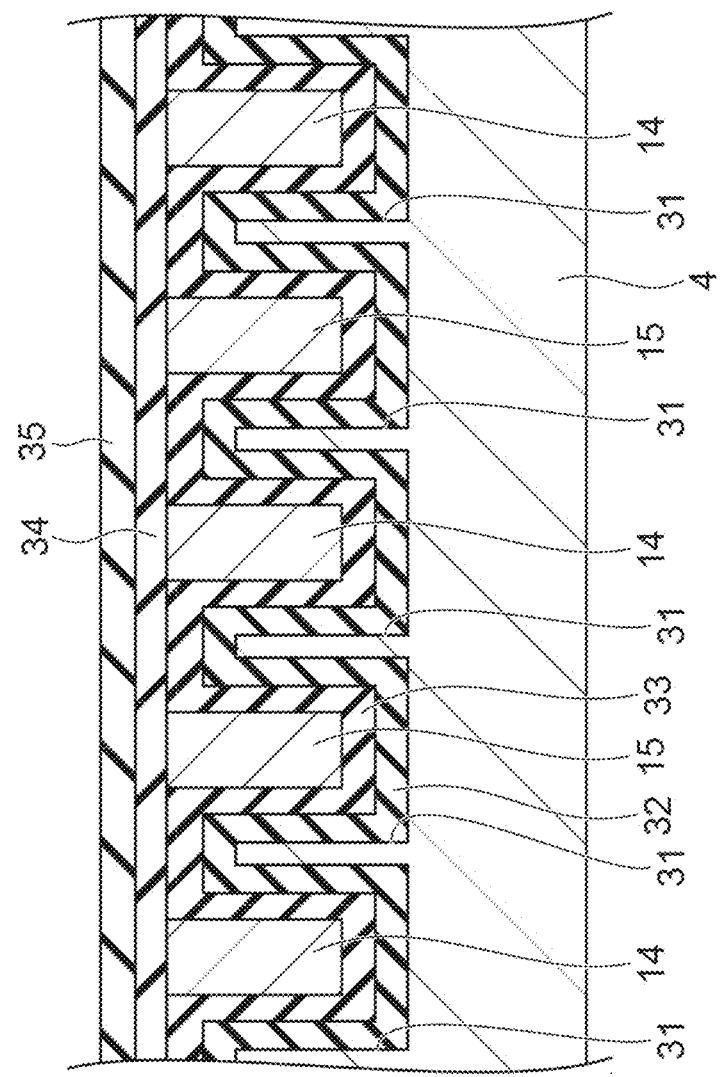
FIG. 2 is a cross-sectional view of a periphery of a coil.
Figure 3:
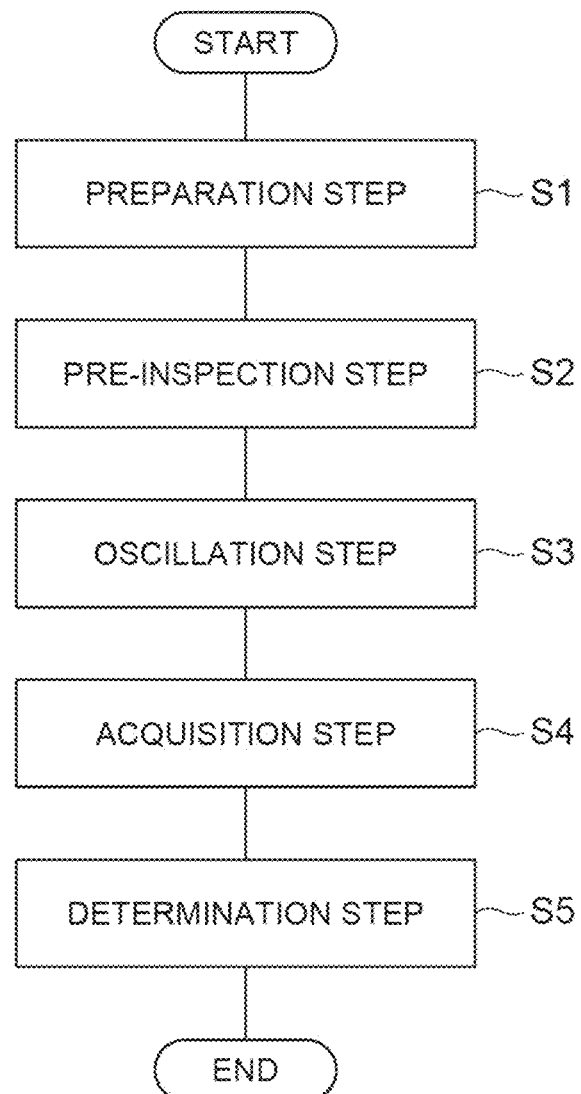
FIG. 3 is a flowchart for describing an actuator device manufacturing method.

As shown in FIGS. 1 and 2, the actuator device 1 further includes a pair of the coils (drive elements) 14 and 15, a first wiring 21, a second wiring 22, a third wiring 23, a fourth wiring 24, and external terminals 25, 26, 27, and 28. Each of the coils 14 and 15 is provided in the second movable portion 4 to surround the first movable portion 3. Each of the coils 14 and 15 is wound multiple times around the first movable portion 3, and is formed in a spiral shape. The pair of coils 14 and 15 are alternately disposed side by side in a width direction of the second movable portion 4.

In FIG. 1, a disposition region R where the coils 14 and 15 are disposed is indicated by hatching. As shown in FIG. 2, the second movable portion 4 is provided with a groove 31 having a shape corresponding to each of the coils 14 and 15. An insulating layer 32 is provided on an inner surface of the groove 31, and an insulating layer 33 is provided on the insulating layer 32. Each of the coils 14 and 15 is disposed in the groove 31 with the insulating layers 32 and 33 sandwiched between each of the coils 14 and 15 and the second movable portion 4. Namely, each of the coils 14 and 15 is configured as a damascene wiring embedded in the groove 31. Each of the coils 14 and 15 is made of, for example, a metal material such as copper or gold.

An insulating layer 34 is provided to cover the coils 14 and 15 and the insulating layer 33. An insulating layer 35 is provided on the insulating layer 34. Each of the insulating layers 32 to 35 is made of, for example, silicon oxide, silicon nitride, silicon oxynitride, or the like. The insulating layers 32 to 35 are integrally formed to cover surfaces of the support portion 2, the first movable portion 3, the second movable portion 4, the first connection portions 5 and 6, and the second connection portions 7 and 8.

The external terminals 25 to 28 are electrode pads provided on the support portion 2, and are electrically connected to a control device or the like disposed outside the actuator device 1. The first wiring 21 is electrically connected to an inner end portion of the coil 14 and the external terminal 25. The first wiring 21 extends from the inner end portion of the coil 14 to the external terminal 25 through the second connection portion 7. The second wiring 22 is electrically connected to an outer end portion of the coil 14 and the external terminal 26. The second wiring 22 extends from the outer end portion of the coil 14 to the external terminal 26 through the second connection portion 8.

The third wiring 23 is electrically connected to an inner end portion of the coil 15 and the external terminal 27. The third wiring 23 extends from the inner end portion of the coil 15 to the external terminal 27 through the second connection portion 7. The fourth wiring 24 is electrically connected to an outer end portion of the coil 15 and the external terminal 28. The fourth wiring 24 extends from the outer end portion of the coil 15 to the external terminal 28 through the second connection portion 8. Similarly to the coils 14 and 15, each of the wirings 21 to 24 is disposed in the groove 31 with the insulating layers 32 and 33 sandwiched between each of the wirings 21 to 24 and the second movable portion 4, and is configured as a damascene wiring embedded in the groove 31. Each of the wirings 21 to 24 is made of, for example, a metal material such as aluminum. Aluminum has a smaller yield stress and is more likely to plastically deform than copper.

In the actuator device 1 configured described above, when a drive current for linear actuation is applied to the coil 14 through the external terminals 25 and 26 and the wirings 21 and 22, a Lorentz force (driving force) acts on the coil 14 due to the interaction with a magnetic field generated by the magnetic field generation portion M. By using the balance between the Lorentz force and elastic forces of the second connection portions 7 and 8, the second movable portion 4 can be oscillated (linearly actuated) around the Y-axis. At this time, the first movable portion 3 (mirror surface 10) also oscillates around the Y-axis, together with the second movable portion 4.

On the other hand, when a drive current for resonant actuation is applied to the coil 15 through the external terminals 27 and 28 and the wirings 23 and 24, a Lorentz force (driving force) acts on the coil 15 due to the interaction with a magnetic field generated by the magnetic field generation portion M. By using the resonance of the first movable portion 3 at a resonant frequency in addition to the Lorentz force, the first movable portion 3 (mirror surface 10) can be resonantly actuated around the X-axis. Specifically, when a drive current of a frequency equal to the resonant frequency of the first movable portion 3 around the X-axis is input to the coil 15, the second movable portion 4 slightly vibrates around the X-axis at the frequency. This vibration is transmitted to the first movable portion 3 through the first connection portions 5 and 6, so that the first movable portion 3 is oscillatable around the X-axis at the frequency.

Figure 4:
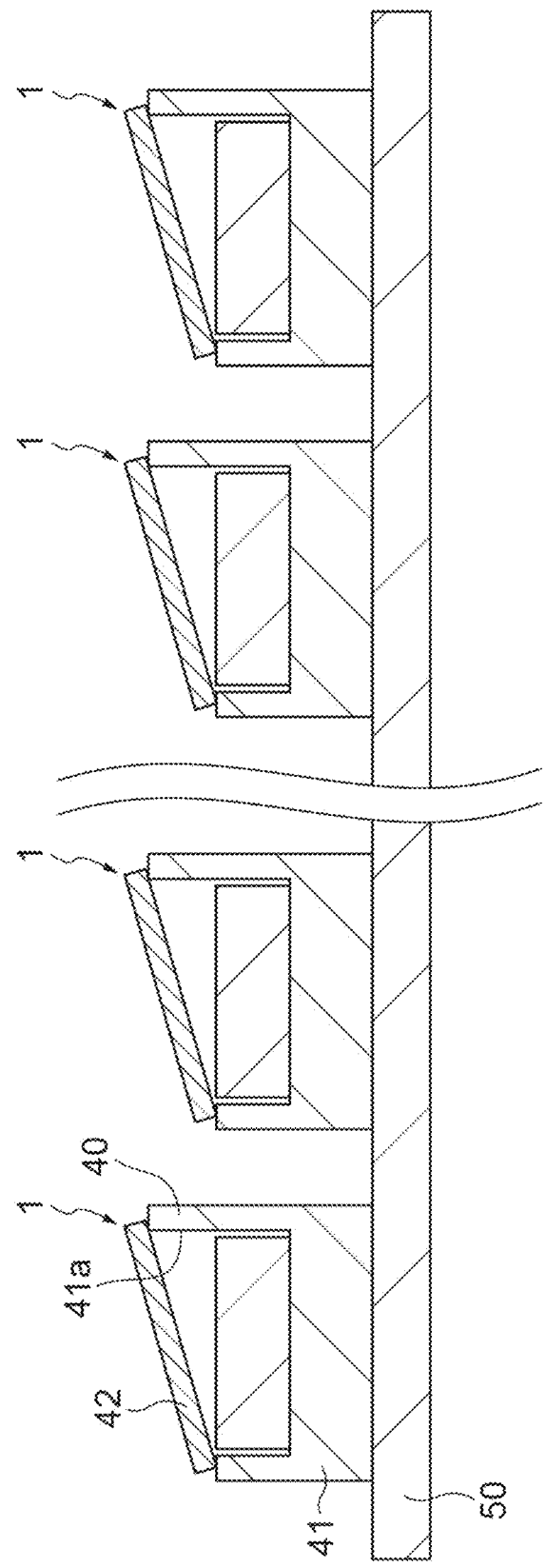
FIG. 4 is a cross-sectional view for describing an oscillation step.

The actuator device 1 further includes a package 40 that houses the support portion 2, the first movable portion 3, the second movable portion 4, the pair of first connection portions 5 and 6, the pair of second connection portions 7 and 8, and the magnetic field generation portion M (FIG. 4). The package 40 is airtightly sealed. The package 40 includes a body portion 41 that houses the actuator device 1, and a window member 42 that is transparent and that is disposed to close an opening 41a of the body portion 41. Light reflected by the actuator device 1 transmits through the window member 42 and is incident on the mirror surface 10.

When the first movable portion 3 is oscillated around the X-axis and the second movable portion 4 is oscillated around the Y-axis, the first connection portions 5 and 6 and the second connection portions 7 and 8 torsionally deform, so that stresses are repeatedly generated in connection portions P1 between the first connection portions 5 and 6 and the second movable portion 4, and in connection portions P2 between the second connection portions 7 and 8 and the second movable portion 4. The stresses act on the coils 14 and 15 and the wirings 21 to 24 (metal members) disposed at the connection portions P1 and P2, so that the coils 14 and 15 and the wirings 21 to 24 can be plastically deformed. Particularly, since the first movable portion 3 is resonantly actuated around the X-axis, large stresses are repeatedly generated in the connection portions P1, and the coils 14 and 15 disposed at the connection portions P1 are likely to plastically deform. When the coils 14 and 15 undergo repeated plastic deformation, work hardening progresses, and the viscous resistance in the vibration of the first movable portion 3 around the X-axis and the viscous resistance in the vibration of the second movable portion 4 around the Y-axis can gradually decrease. Therefore, in the method for manufacturing the actuator device 1 according to the present embodiment, before shipment, the first movable portion 3 and the second movable portion 4 are oscillated for a predetermined time to decrease the viscous resistances in advance.

Actuator Device Manufacturing Method

A method for manufacturing the actuator device 1 (inspection method) will be described with reference to FIGS. 3 to 6. First, a preparation step of preparing a plurality of the actuator devices 1 is performed (step S1). In the preparation step, for example, the actuator devices 1 are prepared by processing an SOI substrate using MEMS technology (patterning, etching, and the like). The actuator devices 1 prepared in the preparation step are airtightly sealed by the packages 40.

Subsequently, a pre-inspection step of checking characteristics of each actuator device 1 is performed (step S2). In the pre-inspection step, for example, the resonant frequency of the first movable portion 3 with respect to vibration around the X-axis, a drive current value applied to the coil 15 to oscillate the first movable portion 3 at a target deflection angle (for example, 20°) around the X-axis, a counter-electromotive force generated in the coil 15 when the first movable portion 3 is oscillated at the deflection angle around the X-axis, and a drive current value applied to the coil 14 to oscillate the second movable portion 4 at a target deflection angle (for example, 12°) around the Y-axis are acquired. Incidentally, the target deflection angle means an optical deflection angle.

In the pre-inspection step, each actuator device 1 is connected to a computer, and the characteristics of each actuator device 1 are checked. For example, the actuator devices 1 are sequentially set one by one in a characteristic inspection device, and the characteristics of each actuator device 1 are checked. In the pre-inspection step, it is also checked whether or not each actuator device 1 is actuated. When the characteristics of the actuator device 1 are known in advance, the pre-inspection step may be omitted. The following oscillation step, acquisition step, and determination step are performed for each actuator device 1.

Subsequently, the oscillation step (aging step) of oscillating the first movable portion 3 and the second movable portion 4 for a predetermined time is performed (step S3). In the oscillation step, for example, as shown in FIG. 4, the plurality (for example, 24) of actuator devices 1 are arranged on a substrate 50. In the oscillation step, for the predetermined time, the first movable portion 3 is oscillated around the X-axis, and the second movable portion 4 is oscillated around the Y-axis. For example, the first movable portion 3 is oscillated to a target deflection angle of 20° around the X-axis, and the second movable portion 4 is oscillated to a target deflection angle of 12° around the Y-axis. The values obtained in the pre-inspection step are used as drive current values for oscillating the first movable portion 3 and the second movable portion 4 to the target deflection angles. In the oscillation step, the drive current value is controlled by feedback control using a counter-electromotive force, such that the deflection angle of the first movable portion 3 around the X-axis becomes the target deflection angle. The oscillation of the second movable portion 4 around the Y-axis is controlled without using feedback control.

The target deflection angles of the first movable portion 3 and the second movable portion 4 correspond to, for example, maximum recommended actuation angles. The larger the deflection angle is, the more likely it is for the coils 14 and 15 to undergo work hardening due to plastic deformation. By actuating the actuator device 1 at an upper limit of a range that can be used at a customer's site, a change in the vibration characteristics at the customer's site can be effectively suppressed. The predetermined time is, for example, 250 hours. The length of time for oscillating the first movable portion 3 and the second movable portion 4 is determined, for example, by experiments or simulations.

In the oscillation step, the first movable portion 3 and the second movable portion 4 are oscillated at a constant temperature. For example, the environmental temperature of the actuator device 1 is kept constant at 60° C. by being disposed in a thermostatic oven. The environmental temperature corresponds to an upper limit of a maximum recommended actuation temperature. The higher the environmental temperature is, the more likely it is for the coils 14 and 15 to undergo work hardening due to plastic deformation. By actuating the actuator device 1 at an upper limit of a range that can be used at a customer's site, a change in the vibration characteristics at the customer's site can be effectively suppressed.

In addition, in the oscillation step, the first movable portion 3 and the second movable portion 4 are oscillated under a constant pressure. The atmospheric pressure of the first movable portion 3 and the second movable portion 4 is kept constant due to being airtightly sealed by the package 40. For example, the inside of the package 40 is decompressed and in a vacuum state.

In addition, in the oscillation step, in a state where the temperature of each of the first movable portion 3, the second movable portion 4, the pair of first connection portions 5 and 6, and the pair of second connection portions 7 and 8 is higher than the temperature of the support portion 2, the first movable portion 3 and the second movable portion 4 are oscillated. In this example, the temperatures of the first movable portion 3, the second movable portion 4, the pair of first connection portions 5 and 6, and the pair of second connection portions 7 and 8 are increased by heat generated by the coils 14 and 15. For example, the temperature of the coils 14 and 15 becomes a high temperature of 200° C. or higher when energized. Accordingly, a decrease in viscous resistance can be promoted.

Figure 5:
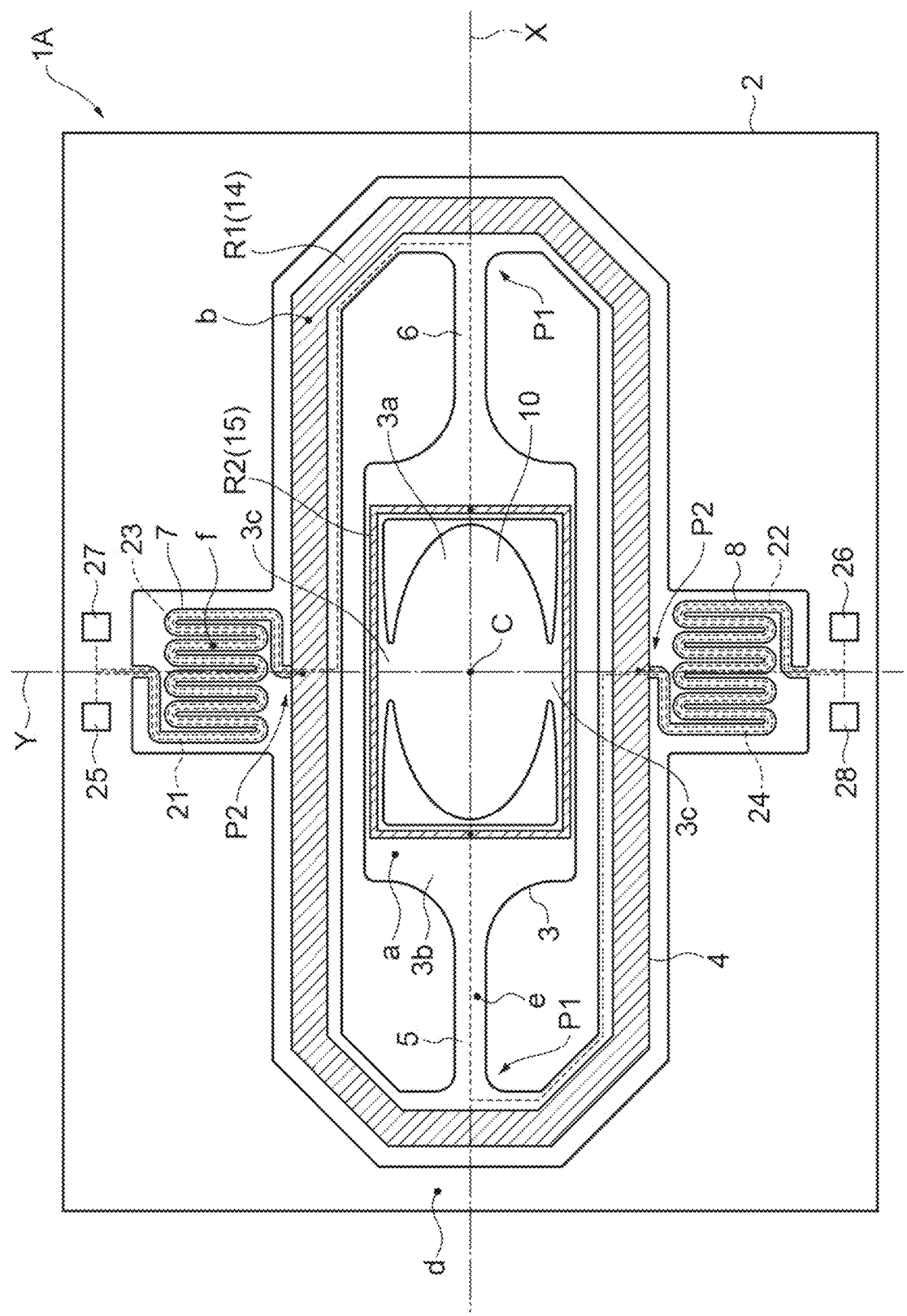
FIG. 5 is a plan view for describing an example of a temperature distribution in the oscillation step.

FIG. 5 is a view for describing an example of a temperature distribution in the oscillation step. An actuator device 1A shown in FIG. 5 has the same configuration as that of the actuator device 1 described above except for the fact that the shapes of the first movable portion 3 and the second movable portion 4 are different, and the fact that the coil 15 is provided in the first movable portion 3 instead of in the second movable portion 4. In the actuator device 1A, the wirings 23 and 24 include portions formed on the pair of first connection portions 5 and 6. In the actuator device 1A, when the first movable portion 3 is oscillated, large stresses are applied particularly to the coil 14 and the wirings 23 and 24 formed in the vicinities of the connection portions P1, and the work hardening of the coil 14 and the wirings 23 and 24 is likely to progress. In FIG. 5, a disposition region R1 where the coil 14 is disposed and a disposition region R2 where the coil 15 is disposed are indicated by hatching. In this example, a drive current of 14 mA was applied to the coil 15 and a drive current of 30 mA was applied to the coil 14 to drive the actuator device 1A. The environmental temperature was set to 25° C., and the atmospheric pressure was set to normal pressure (1 atm).

As shown in FIG. 5, a point a is set on the annular portion 3b of the first movable portion 3, a point b is set on the second movable portion 4, a point c is set on the mirror surface 10 (body portion 3a of the first movable portion 3), a point d is set on the support portion 2, a point e is set on the first connection portion 5, and a point f is set on the second connection portion 7. When the actuator device 1A was driven, the temperatures at the points a to f each were 89.6° C., 104.4° C., 94.6° C., 41.5° C., 75.2° C., and 146.1° C. As such, the temperature of each of the first movable portion 3, the second movable portion 4, the pair of first connection portions 5 and 6, and the pair of second connection portions 7 and 8 became higher than the temperature (41.5° C.) of the support portion 2.

Figure 6:
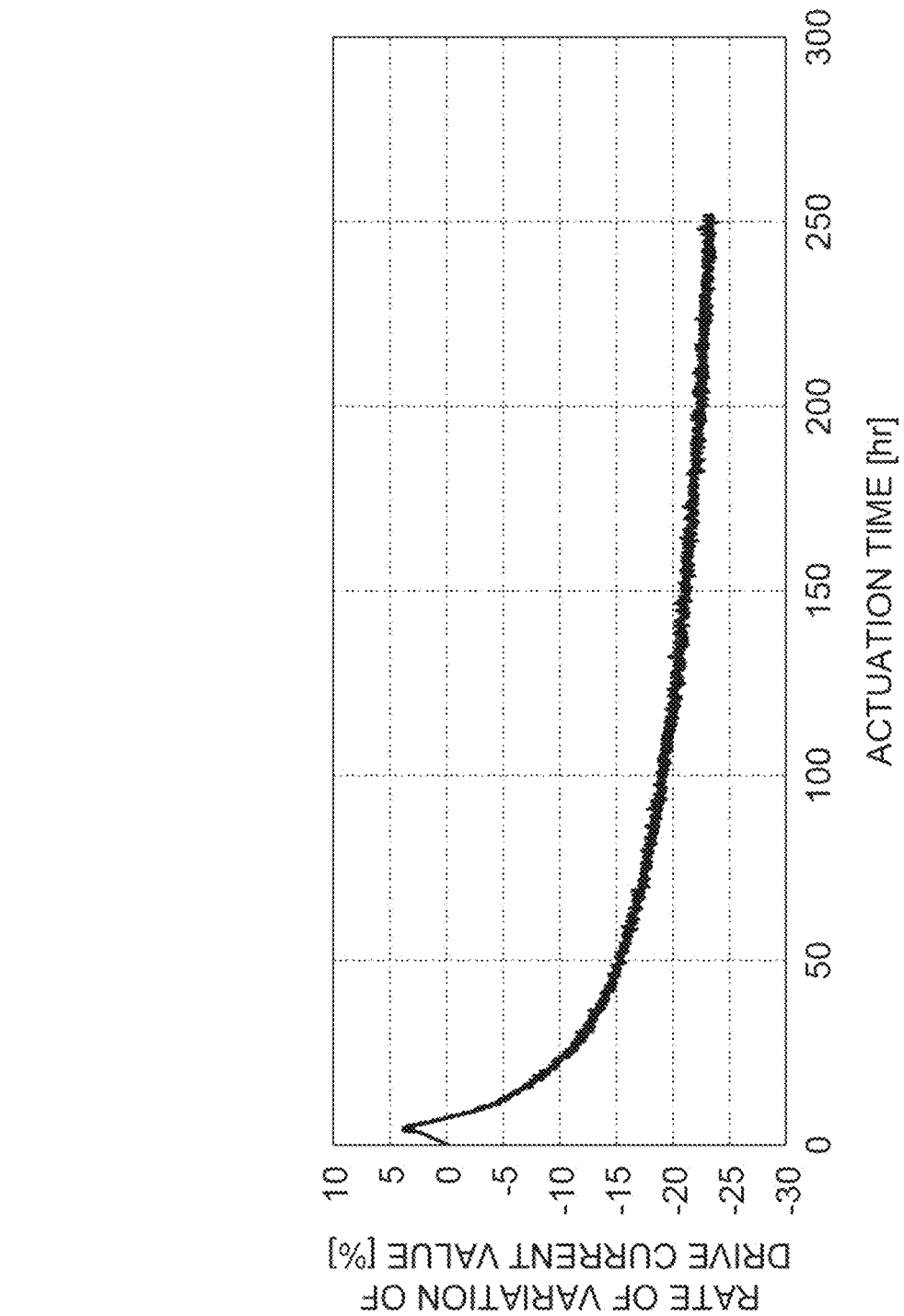
FIG. 6 is a graph showing an example of the relationship between actuation time and the rate of variation of drive current value.

FIG. 6 is a graph showing an example of the relationship between actuation time and the rate of variation of drive current value. In the example of FIG. 6, the actuator device 1 was used. Similarly to the above-described conditions, the target deflection angle of the first movable portion 3 around the X-axis was set to 20°, and the target deflection angle of the second movable portion 4 around the Y-axis was set to 12°. The environmental temperature was set to 60° C., and the actuation time was set to 250 hours. The vertical axis of FIG. 6 represents the rate of variation of a drive current value applied to the coil 15 to oscillate the first movable portion 3 to the target deflection angle around the X-axis. The drive current value decreases as the viscous resistance in the vibration of the first movable portion 3 around the X-axis decreases. The rate of variation of the drive current value is the ratio of a difference between a drive current value at the start of actuation and a current drive current value to the drive current value at the start of actuation.

From FIG. 6, it can be seen that the drive current value greatly varies immediately after the start of actuation but the variation of the drive current value decreases over actuation time. From this, it can be seen that the variation of the drive current value over usage time can be suppressed by performing the oscillation step.

Subsequently to the oscillation step, an acquisition step of acquiring a parameter related to the viscous resistance in the vibration of the first movable portion 3 around the X-axis is performed (step S4). In this example, the acquired parameter is the drive current value applied to the coil 15 to oscillate the first movable portion 3 to the target deflection angle (20°) around the X-axis. The environmental temperature is set to, for example, 25° C.

Subsequently, the determination step of determining whether the actuator device 1 is qualified or disqualified, based on a value of the parameter acquired in the acquisition step is performed (step S5). In the determination step, when a difference (absolute value) between the parameter acquired in the acquisition step and a reference value corresponding to the parameter at the start of the oscillation step is a predetermined value or more in a direction in which the viscous resistance decreases, it is determined that the actuator device 1 is qualified, and when the difference is less than the predetermined value, it is determined that the actuator device 1 is disqualified. For example, the actuator device 1 determined to be qualified is shipped, and the actuator device 1 determined to be disqualified is rejected without being shipped.

In this example, the drive current value at the start of the oscillation step (drive current value acquired in the pre-inspection step) is set as the reference value, and the predetermined value is set to 2%. When the rate of variation of the drive current value is 2% or more (when the drive current value decreases by 2% or more), it is determined that the viscous resistance has decreased and the actuator device 1 is qualified, whereas when the rate of variation of the drive current value is smaller than 2%, it is determined that the actuator device 1 is disqualified. The rate of variation of the drive current value is the ratio of a difference between the drive current value at the start of the oscillation step and the drive current value acquired in the acquisition step to the drive current value at the start of the oscillation step. Incidentally, in this example, the rate of variation of the parameter is compared to the predetermined value (threshold value); however, the difference between the drive current value acquired in the acquisition step and the drive current value at the start of the oscillation step may be compared to the predetermined value. The actuator device 1 in which the viscous resistance is reduced in advance by the above steps can be obtained.

Functions and Effects

In the method for manufacturing the actuator device 1, after the oscillation step of oscillating the first movable portion 3 around the X-axis for the predetermined time, the acquisition step of acquiring a value of the parameter related to the viscous resistance in the vibration of the first movable portion 3 around the X-axis is performed. Then, when the difference between the parameter acquired in the acquisition step and the reference value corresponding to the parameter at the start of the oscillation step is the predetermined value or more in the direction in which the viscous resistance decreases, it is determined that the actuator device 1 is qualified, and when the difference is less than the predetermined value, it is determined that the actuator device 1 is disqualified. For example, the actuator device 1 determined to be qualified is shipped, and the actuator device 1 determined to be disqualified is not shipped. By reducing the viscous resistance in advance through oscillating the first movable portion 3 and the second movable portion 4 for the predetermined time before shipment, a change in the vibration characteristics of the first movable portion 3 and the second movable portion 4 at a customer's site can be suppressed, and the quality of the actuator device 1 can be stabilized. In addition, there can exist the actuator device 1 in which the viscous resistance does not decrease even when the first movable portion 3 and the second movable portion 4 are oscillated for the predetermined time; however, by determining that the actuator device 1 in which the difference between the acquired parameter and the reference value is the predetermined value or more is qualified, only the actuator device 1 in which the viscous resistance has decreased can be shipped, and as a result, the quality of the actuator device 1 can be further stabilized. Therefore, according to the method for manufacturing the actuator device 1, the actuator device 1 having stable quality can be obtained.

Further description will be provided on the point that there can exist the actuator device 1 in which the viscous resistance does not decrease even when the first movable portion 3 and the second movable portion 4 are oscillated for the predetermined time. The viscous resistance in the vibration of the first movable portion 3 and the second movable portion 4 changes due to not only the work hardening of the coils 14 and 15 (metal members) but also a change in air resistance. The air resistance changes according to atmospheric pressure or temperature. For this reason, for example, when the degree of vacuum in the package 40 has decreased and the atmospheric pressure has increased during the oscillation step, an increase in viscous resistance due to the air resistance may be larger than a decrease in viscous resistance due to the work hardening of the coils 14 and 15, and as a result, the total viscous resistance may increase. In addition, the viscous resistance can also be changed by structural malfunction. For these reasons, there can exist the actuator device 1 in which the viscous resistance does not decrease even when the first movable portion 3 and the second movable portion 4 are oscillated for the predetermined time. On the other hand, according to the method for manufacturing the actuator device 1 described above, only the actuator device 1 in which the sealed state of the package 40 is satisfactory can be determined to be qualified and can be shipped.

The parameter relates to a drive current value for obtaining a predetermined deflection angle. Accordingly, a change in viscous resistance can be suitably assessed.

In the oscillation step, in a state where the temperature of each of the first movable portion 3, the second movable portion 4, the pair of first connection portions 5 and 6, and the pair of second connection portions 7 and 8 is higher than the temperature of the support portion 2, the first movable portion 3 and the second movable portion 4 are oscillated. Accordingly, the viscous resistance can be effectively reduced.

In the oscillation step, the first movable portion 3 and the second movable portion 4 are oscillated at a constant temperature. Accordingly, for example, by performing the oscillation step at the same temperature as in a usage environment at a customer's site, a change in the vibration characteristics of the first movable portion 3 and the second movable portion 4 at the customer's site can be reliably suppressed.

In the oscillation step, the first movable portion 3 and the second movable portion 4 are oscillated under a constant pressure. Accordingly, a change in viscous resistance due to a change in the atmospheric pressure can be suppressed, and a change in viscous resistance due to the work hardening of the coils 14 and 15 and the wirings 21 to 24 (metal materials that undergo repeated plastic deformation due to driving) can be suitably assessed.

The oscillation step, the acquisition step, and the determination step are performed for each of the plurality of actuator devices 1. Accordingly, the actuator devices 1 having stable quality can be efficiently manufactured.

The coils 14 and 15 that generate driving forces to oscillate the first movable portion 3 and the second movable portion 4 form metal members on which stresses act when the first movable portion 3 oscillates around the X-axis and the second movable portion 4 oscillates around the Y-axis. Accordingly, the quality of the actuator device 1 including the coils 14 and 15 can be stabilized.

The coils 14 and 15 are embedded in the groove 31. In this case, the cross-sectional areas of the coils 14 and 15 become large, and the coils 14 and 15 are likely to undergo work hardening due to repeated plastic deformation; however, according to the method for manufacturing the actuator device 1, even in such a case, a change in the vibration characteristics of the first movable portion 3 at a customer's site can be suppressed.

The actuator device 1 includes the package 40 that is airtightly sealed and that houses the support portion 2, the first movable portion 3, the second movable portion 4, the pair of first connection portions 5 and 6, the pair of second connection portions 7 and 8. Accordingly, a change in viscous resistance due to a change in the atmospheric pressure can be suppressed, and a change in viscous resistance due to the work hardening of the coils 14 and 15 can be suitably assessed.

In the oscillation step, for the predetermined time, the first movable portion 3 is oscillated around the X-axis, and the second movable portion 4 is oscillated around the Y-axis. Accordingly, the oscillation step can be performed in the same actuation state as in a usage environment at a customer's site, and a change in the vibration characteristics of the first movable portion 3 and the second movable portion 4 at the customer's site can be reliably suppressed. In addition, when movable portions are oscillated around a plurality of axes, the drive current values become large, and the environmental temperature is likely to become high; however, according to the method for manufacturing the actuator device 1, even in such a case, a change in the vibration characteristics of the first movable portion 3 and the second movable portion 4 at a customer's site can be suppressed.

In the oscillation step, the first movable portion 3 is resonantly actuated. In this case, stresses acting on the coils 14 and 15 become large, and the coils 14 and 15 are likely to undergo work hardening due to repeated plastic deformation; however, according to the method for manufacturing the actuator device 1, even in such a case, a change in the vibration characteristics of the first movable portion 3 and the second movable portion 4 at a customer's site can be suppressed.

The viscous resistances in the vibration of the first movable portion 3 and the second movable portion 4 can be changed not only by work hardening of the coils 14 and 15 but also by work hardening of the wirings 21 to 24 disposed at the connection portions P1 and P2. Namely, in the above embodiment, the wirings 21 to 24 also form metal members on which stresses act when the first movable portion 3 oscillates around the X-axis and the second movable portion 4 oscillates around the Y-axis. According to the method for manufacturing the actuator device 1, the quality of the actuator device 1 including the wirings 21 to 24 electrically connected to the coils 14 and 15 can be stabilized.

In addition, the wirings 21 to 24 are embedded in the groove 31. In this case, the cross-sectional areas of the wirings 21 to 24 become large, and the wirings 21 to 24 are likely to undergo work hardening due to repeated plastic deformation; however, according to the method for manufacturing the actuator device 1, even in such a case, a change in the vibration characteristics of the first movable portion 3 and the second movable portion 4 at a customer's site can be suppressed.

MODIFICATION EXAMPLES

The present disclosure is not limited to the above embodiment. For example, the material and the shape of each configuration are not limited to the material and the shape described above, and various materials and shapes can be adopted.

The mirror surface 10 may be disposed such that a stress acts thereon when the first movable portion 3 oscillates around the X-axis and the second movable portion 4 oscillates around the Y-axis. In this case, the viscous resistances in the vibration of the first movable portion 3 and the second movable portion 4 can be changed not only by work hardening of the coils 14 and 15 and the wirings 21 to 24 but also by work hardening of the mirror surface 10. Namely, the mirror surface 10 may form a metal member on which a stress acts on when the first movable portion 3 oscillates around the X-axis and the second movable portion 4 oscillates around the Y-axis. The metal member may be formed of at least one of the coils 14 and 15, the wirings 21 to 24, and the mirror surface 10.

The drive elements are not limited to the coils 14 and 15, and may be, for example, piezoelectric elements. The coils 14 and 15 may be formed on a surface of the second movable portion 4 instead of in the groove 31. At least some of the wirings 21 to 24 may be configured as surface wirings formed on a surface of the support portion 2, the second movable portion 4, or the second connection portions 7 and 8. The coil 15 may be provided in the first movable portion 3. The actuation of the first movable portion 3 may be linear actuation (non-resonant actuation). The second movable portion 4 and the second connection portions 7 and 8 may be omitted. In this case, the first movable portion 3 may be directly connected to the support portion 2 by the first connection portions 5 and 6. In this case, the actuation of the first movable portion 3 may be resonant actuation or linear actuation. Namely, in the above embodiment, the actuator device 1 has a resonant axis (high-speed axis and X-axis) and a linear axis (low-speed axis and Y-axis); however, the actuator device 1 may have only one of the resonant axis and the linear axis. The first axis around which the first movable portion 3 oscillates and the second axis around which the second movable portion 4 oscillates may intersect at an angle other than being perpendicular, and may be parallel to each other or may be located on the same straight line. The actuator device 1 may be a metal mirror in which the support portion (substrate), the connection portions, and the movable portions are made of metal materials.

The parameter is not limited to the drive current value for obtaining the predetermined deflection angle, and may relate to a Q value (quality factor), a resonant frequency, or a deflection angle when a predetermined drive current value is applied. Even in this case, a change in viscous resistance can be suitably assessed. The parameter may be these values themselves or may be values that change according to these values. On the other hand, in the case of the actuator device 1 described above, it is preferable that the drive current value is used as the parameter. This point will be further described with reference to FIGS. 7 and 8.

Figure 7:
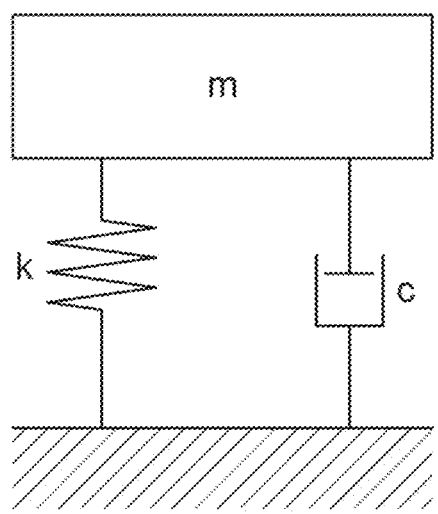
FIG. 7 is a view showing a vibration model of the actuator device.

FIG. 7 is a view showing a vibration model of the actuator device 1. In FIG. 7, the actuator device 1 is modeled using a damped vibration system model. In FIG. 7, m represents the mass, k represents the spring constant, and c represents the damping coefficient. A resonant frequency $\omega_d$ of this model is expressed by Equation (1).

$$\omega_d = \sqrt{1-\zeta^2}\omega_0 \qquad \text{[Equation 1]}$$

In Equation (1), $\omega_0$ is the natural angular frequency, and is expressed by an inertia moment J and the spring constant k as shown in Equation (2). The natural angular frequency $\omega_0$ is determined by design dimensions and mechanical properties of the materials used, and is almost not affected by aging.

[Equation 2]

$$\omega_0 = \sqrt{\frac{k}{J}} \qquad (2)$$

The relationship between a damping ratio $\zeta$ and the Q value is expressed by Equation (3).

[Equation 3]

$$\zeta = \frac{1}{2Q} \qquad (3)$$

As one example, the actuator device 1 has a very high Q value of approximately 10000. For this reason, the damping ratio $\zeta$ becomes very small, and even when the Q value varies to some extent, the resonant frequency $\omega_d$ hardly varies.

The relationship between a drive current value I and the Q value is expressed by Equation (4).

[Equation 4]

$$\theta = \frac{T_{(I)} \times Q}{k} \qquad (4)$$

In Equation (4), $\theta$ is the deflection angle, $T_{(I)}$ is the torque when the drive current value is I, and Q is the Q value. Therefore, when the deflection angle $\theta$ and the spring constant k are assumed to be constants, the relationship between the torque $T_{(I)}$ and the Q value is expressed by Equation (5), and the torque $T_{(I)}$ and the Q value have an inversely proportional relationship.

[Equation 5]
$$T_{(I)} - = k\theta \times \frac{1}{Q} \quad (5)$$

In addition, the relationship between the damping ratio $\zeta$ and the damping coefficient c that is a material property value representing the magnitude of viscous resistance is expressed by Equation (6).

[Equation 6]
$$\zeta = \frac{c}{c_c} = \frac{c}{2\sqrt{Jk}} \quad (6)$$

In Equation (6), $c_C$ is the critical damping coefficient, and is a constant determined by the inertia moment J and the spring constant k. Therefore, from the above relationship, when the damping coefficient c decreases due to aging, the damping ratio $\zeta$ decreases and the Q value increases. On the other hand, the torque $T_{(I)}$ and the drive current value I that are in an inversely proportional relationship with the Q value decrease. Namely, when the viscous resistance decreases, the Q value increases, the drive current value for obtaining the predetermined deflection angle decreases, and the deflection angle when the predetermined drive current is applied increases.

Figure 8:
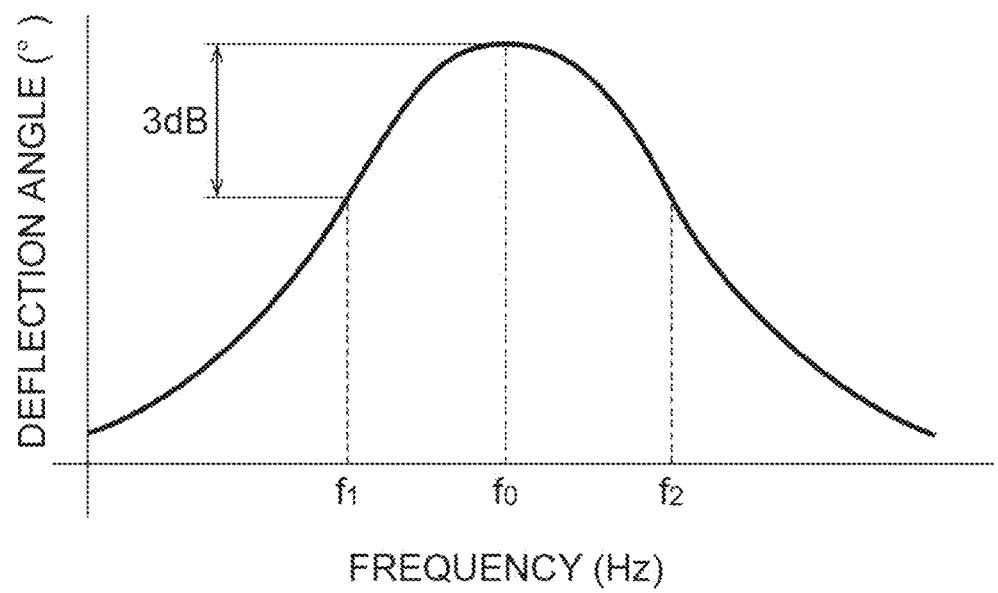
FIG. 8 is a graph for describing a method for calculating a Q value using a half-power bandwidth method.

A method for calculating a Q value using a half-value width method will be described with reference to FIG. 8. By changing the frequency in a state where the drive current value is set to a constant value, the frequency response characteristics of the deflection angle shown in FIG. 8 are obtained. By measuring a frequency $f_0$ (resonant frequency) at which the deflection angle becomes maximum and frequencies $f_1$ and $f_2$ at which the deflection angle becomes −3 dB (approximately 0.7 times) of the maximum deflection angle, from the obtained data, the Q value can be calculated using $Q=f_0/(f_2-f_1)$. The half-value width method is applicable when the frequency response characteristics have a shape that is nearly symmetrical with respect to the left and right sides. In the actuator device 1 described above, since the frequency response has an asymmetrical shape with the peak tilted toward the right side, it is difficult to accurately calculate the Q value using the half-value width method. For this reason, in the method for manufacturing the actuator device 1 described above, the decrease in viscous resistance is evaluated using the drive current value (torque) that is a parameter inversely proportional to the Q value.

In addition, in the method for manufacturing the actuator device 1 described above, the parameter may be the deflection angle when the predetermined drive current value is applied. For example, a change in the deflection angle may be observed by continuously actuating the actuator device 1 in a state where the drive current value is set to a constant value. However, continuously actuating the actuator device 1 in a state where the deflection angle is set to a constant value with the parameter being the drive current value is preferable in that an aging condition is not changed by the change in the deflection angle. In addition, when the first movable portion 3 is linearly actuated instead of being resonantly actuated, the Q value can be easily measured, so that the Q value may be used as the parameter.

REFERENCE SIGNS LIST 1, 1A: actuator device, 2: support portion, 3: first movable portion, 4: second movable portion, 5, 6: first connection portion, 7, 8: second connection portion, 14, 15: coil (drive element), 21 to 24: wiring, 40: package.

The invention claimed is:
1. An actuator device manufacturing method comprising: in the following order,
   a preparation step of preparing an actuator device including a support portion, a movable portion, a connection portion that connects the movable portion to the support portion such that the movable portion is oscillatable around a predetermined axis, and a metal member disposed such that a stress acts on the metal member when the movable portion oscillates around the axis;
   an oscillation step of oscillating the movable portion around the axis for a predetermined time;
   an acquisition step of acquiring a parameter related to a viscous resistance in a vibration of the movable portion around the axis; and
   a determination step of determining that the actuator device is qualified, when a difference between the parameter acquired in the acquisition step and a reference value corresponding to the parameter at a start of the oscillation step is a predetermined value or more in a direction in which the viscous resistance decreases, and determining that the actuator device is disqualified, when the difference is less than the predetermined value.

2. The actuator device manufacturing method according to claim 1,
   wherein the parameter relates to a Q value, a resonant frequency, a drive current value for obtaining a predetermined deflection angle, or a deflection angle when a predetermined drive current is applied.

3. The actuator device manufacturing method according to claim 1,
   wherein in the oscillation step, the movable portion is oscillated in a state where a temperature of each of the movable portion and the connection portion is higher than a temperature of the support portion.

4. The actuator device manufacturing method according to claim 1,
   wherein in the oscillation step, the movable portion is oscillated at a constant temperature.

5. The actuator device manufacturing method according to claim 1,
   wherein in the oscillation step, the movable portion is oscillated under a constant pressure.

6. The actuator device manufacturing method according to claim 1,
   wherein in the preparation step, a plurality of the actuator devices are prepared, and
   the oscillation step, the acquisition step, and the determination step are performed for each of the plurality of actuator devices.

7. The actuator device manufacturing method according to claim 1,
   wherein the actuator device prepared in the preparation step further includes a package that is airtightly sealed and houses the support portion, the movable portion, the connection portion, and the metal member.

8. The actuator device manufacturing method according to claim 1,
- wherein in the actuator device prepared in the preparation step, the movable portion includes a first movable portion and a second movable portion,
- the connection portion includes a first connection portion that connects the first movable portion to the second movable portion such that the first movable portion is oscillatable around a first axis, and a second connection portion that connects the second movable portion to the support portion such that the second movable portion is oscillatable around a second axis, and
- in the oscillation step, for the predetermined time, the first movable portion is oscillated around the first axis, and the second movable portion is oscillated around the second axis.

9. The actuator device manufacturing method according to claim 1,
- wherein in the oscillation step, the movable portion is resonantly actuated.

10. The actuator device manufacturing method according to claim 1,
- wherein the actuator device prepared in the preparation step includes a coil that generates a driving force to oscillate the movable portion, and the coil forms the metal member.

11. The actuator device manufacturing method according to claim 10,
- wherein the coil is embedded in a groove.

12. The actuator device manufacturing method according to claim 1,
- wherein the actuator device prepared in the preparation step includes a drive element that generates a driving force to oscillate the movable portion, and a wiring electrically connected to the drive element, and the wiring forms the metal member.

13. The actuator device manufacturing method according to claim 12,
- wherein the wiring is embedded in a groove.

* * * * *